United States Patent [19]
Felts

[11] Patent Number: 5,516,555
[45] Date of Patent: May 14, 1996

[54] EVAPORATION METHOD FOR FORMING A GAS BARRIER FILM HAVING AN ORGANOSILICON DISPERSED DISCONTINUOUSLY IN AN INORGANIC MATRIX

[75] Inventor: John T. Felts, Alameda, Calif.

[73] Assignee: The BOC Group, Inc., New Providence, N.J.

[21] Appl. No.: 424,677

[22] Filed: Apr. 18, 1995

Related U.S. Application Data

[62] Division of Ser. No. 149,160, Nov. 8, 1993, Pat. No. 5,434,008, which is a continuation of Ser. No. 873,879, Apr. 22, 1992, abandoned, which is a continuation of Ser. No. 563,508, Aug. 7, 1990, abandoned.

[51] Int. Cl.$^6$ .................................................. C23C 16/44
[52] U.S. Cl. ................................... 427/255.3; 427/255.2; 427/567
[58] Field of Search ........................ 427/255.2, 255.3, 427/567

[56] References Cited

U.S. PATENT DOCUMENTS

| | | |
|---|---|---|
| 3,442,686 | 5/1969 | Jones . |
| 3,791,852 | 2/1974 | Bunshah . |
| 3,849,168 | 11/1974 | Hoffman, Jr. ................ 427/255.2 |
| 4,105,821 | 8/1978 | Blaich et al. . |
| 4,422,915 | 12/1983 | Wielonski . |
| 4,448,802 | 5/1984 | Buhl et al. . |
| 4,503,126 | 5/1985 | Phillips et al. . |
| 4,552,791 | 11/1985 | Hahn . |
| 4,619,748 | 10/1986 | Moll et al. . |
| 4,702,963 | 10/1987 | Phillips et al. . |
| 4,735,832 | 4/1988 | Ichikawa et al. . |
| 4,792,488 | 12/1988 | Schirmer . |
| 4,803,126 | 2/1989 | Wyman . |
| 4,888,249 | 12/1989 | Flores et al. . |
| 4,894,291 | 1/1990 | Ofstein . |
| 4,898,328 | 2/1990 | Fox et al. ........................ 239/6 |

FOREIGN PATENT DOCUMENTS

| | | |
|---|---|---|
| 0025772 | 9/1980 | European Pat. Off. . |
| 0113555 | 12/1983 | European Pat. Off. . |
| 0299754 | 7/1988 | European Pat. Off. . |
| 1449835 | 9/1976 | United Kingdom . |

OTHER PUBLICATIONS

Sacher, et al., Journal of Applied Polymer Science, 38, (1984), pp. 163–171.
Wielonski, et al. Thin Solid Films, 84 (1981), pp. 425–426.
Beale, Industrial Research & Development, Jul. 1981, pp. 135–139.
Kampfrath, et al., Vacuum, vol. 38, No. 1, 1988, pp. 1–3.
Asano, Thin Solid Films, 105 (1983), pp. 1–8.
Martinu, et al. Vacuum, vol. 35, Nos. 4–5, 1985, pp. 171–176.
Kay, et al. J. Vac. Sci. Technol., A2(2), Apr.–Jun. 1984, pp. 401–404.
Martinu, et al. Thin Solid Films, 141 (1986), pp. L83–L85.
Biederman, Vacuum, vol. 34, Nos. 3–4, 1984, pp. 405–410.
Martinu, Thin Solid Films, 140 (1986), pp. 307–319.
Biederman, et al. "Metal Doped Polymer Films", Advances in Low–Temperature Plasma Chemistry, Technology, Applications, vol. 1, 1984, pp. 37–48.
Boonthanom, et al. Thin Solid Films, 24 (1974), pp. 295–306.
Bunshah, et al. Surface And Coatings Technology, 27 (1986), pp. 1–21.
Schiller, et al. Surface And Coatings Technology, 33 (1987), pp. 367–, 377.

*Primary Examiner*—Terry J. Owens
*Attorney, Agent, or Firm*—David A. Draegert; Salvatore P. Pace

[57] ABSTRACT

Films are coated on substrates, useful for applications such as packaging, having a substantially continuous inorganic matrix in which organosilicon moieties are discontinuously dispersed. The inorganic matrix is formed by evaporating an inorganic source within a evacuated chamber while at the same time flowing vaporized organosilicon into the chamber adjacent to an electrically isolated substrate.

6 Claims, 2 Drawing Sheets

EVAPORATION METHOD FOR FORMING A GAS BARRIER FILM HAVING AN ORGANOSILICON DISPERSED DISCONTINUOUSLY IN AN INORGANIC MATRIX

This is a division of application Ser. No. 08/149,160, filed Nov. 8, 1993, now U.S. Pat. No. 5,434,008; which is a continuation of application Ser. No. 07/873,879, filed Apr. 22, 1992, now abandoned; which is a continuation of application Ser. No. 07/563,508, filed Aug. 7, 1990, now abandoned.

FIELD OF THE INVENTION

The present invention generally relates to vacuum deposited coatings useful as barriers to gas and moisture permeation, and more particularly relates to very thin, primarily inorganic coatings, but with discontinuously included organosilicon, that are produced in vacuum chambers and are useful in producing films with reduced gas and water permeability for applications such as packaging of foods.

BACKGROUND OF THE INVENTION

Films with reduced permeability to vapors such as water, oxygen, and carbon dioxide are useful for a variety of applications, one of which is to package foods. Such films are typically composites of materials. For example, one layer is often a flexible polymer, such as a polyethylene or polypropylene, while another layer is coated on or coextruded with the one layer and serves as a barrier layer. Barrier layers can generally be viewed as substantially organic based or substantially inorganic based.

Examples of organic barrier layers are described in a number of U.S. Patents. For example, U.S. Pat. No. 4,792,488, issued Dec. 20, 1988, inventor Schirmer, describes a coextruded multilayer film said to have high oxygen barrier properties and composed of saran (e.g., polyvinylidene chloride copolymers or PVDC). U.S. Pat. No. 4,894,291, issued Jan. 16, 1990, inventor Ofstein, describes oxygen barrier materials in laminates that include nylon, PVDC, and polyethylene terephthalate (PET) and ethylene vinyl alcohol copolymers. U.S. Pat. No. 4,888,249, issued Dec. 19, 1989, inventors Flores et al., describes composites or multi-layers of saran polymers with polyamides or high density polyethylene to assist in oxygen, water, and aroma barrier properties. However, such organic composites pose problems in recycling since they often cannot be simply melted and reformed and they can pose flavor or taste change problems.

U.S. Pat. No. 4,422,915, issued Dec. 27, 1983, inventor Wielonski, describes coatings that are substantially polymeric and consist essentially of a plasma formed polymer matrix, but with particulates distributed in the cross-linked polymer, such as aluminum, boron, nickel, and the like metals and metalloid elements, in order to alter the color of the polymer and to provide selected visual colors. Applications for these colored polymeric coatings are suggested as coating sheet steel for corrosion protection, encapsulating coatings for microelectric circuits and serving as decorative and/or protective coatings for metal, paper, glass, cloth, and plastic materials and articles. The cross-linked polymer is formed by flowing a plasma-polymerizable material (such as hexamethyldisiloxane) into a vacuum chamber while concurrently imposing an r.f. current through a cathode which includes a substrate affixed thereto. An electron beam is struck and produces the particulates in the deposited plasma-form polymer by evaporating the appropriate metal. However, these substantially organic films are not necessarily inert where one would wish inertness due to the desired application.

Inorganic barrier coatings are known and typically are advantageously inert. These inorganic coatings can be produced as thin layers in vacuum deposition chambers. For example, U.S. Pat. No. 3,442,686, issued May 6, 1969, inventor Jones, describes a packaging film composite in which silicon oxide coatings in the range of 0.2 to 2 microns are produced by electron beam evaporation of silicon monoxide in a vacuum chamber. The patentee describes these inorganic coatings as substantially continuous. More recently, U.S. Pat. No. 4,702,963, issued Oct. 27, 1987, inventors Phillips et al., describes flexible polymer packaging films having thin films of inorganic coatings. The inorganic coatings are silicon dioxide or monoxide in which at least chromium, tantalum, nickel, molybdenum, or oxides of these materials are co-deposited and are said to serve as an adhesion layer and assist in lower gas and vapor permeability. Layers are suggested to be produced in a roll coating machine with vacuum deposition chambers.

SUMMARY OF THE INVENTION

It is an object of the present invention to provide substantially inorganic, inert films that are coated on substrates and reduce the gas permeability of the coated substrate.

It is another object of the present invention to provide very thin substantially inorganic films that can be produced very rapidly.

In one aspect of the present invention, an article of manufacture defines a one side and an opposed other side with a determinable gas permeability therebetween. A film effective to reduce the gas permeability between the one and other side is coated on the article. This film has an inorganic component and an organosilicon component. The inorganic component is substantially continuous and is adherently carried on at least the one or the other side of the article. The organosilicon component is discontinuous and constitutes a minor amount of the film.

The substantially continuous inorganic component is derived from evaporating an inorganic evaporative source in a coating chamber, such as by means of electron beam evaporation of metals, metalloids, and their oxides or nitrides. The discontinuous organosilicon component can be viewed as dispersed within a matrix formed by the substantially continuous inorganic component. The organosilicon component of the film is obtained by flowing an organosilicon gas stream into the coating chamber while the inorganic evaporative source is generating inorganic evaporated species. The organosilicon component is incorporated into the growing film and is bound therein in a substantially monomeric molecular form.

In another aspect of the present invention, a method for coating a surface with a gas barrier film comprises providing a substrate, contacting the substrate surface with an inorganic evaporated species derived from evaporating an inorganic evaporative source to form a substantially continuous inorganic film on the substrate surface, and incorporating an organosilicon into the forming film while maintaining the surface in electrical isolation from the chamber. The incorporated organosilicon is substantially discontinuous and is in monomeric form within the film.

Articles of the invention are particularly useful for food packaging applications. Because the films are substantially inorganic, they are inert. Since the films are very thin, the packaging can typically be recycled by melting and reforming.

DETAILED DESCRIPTION OF THE PREFERRED EMBODIMENTS

Practice of a method in accordance with the invention takes place in an evacuated chamber in which an inorganic evaporated species is coated onto a substrate. This inorganic evaporated species is derived from an inorganic evaporative source. Suitable evaporative sources are based upon either resistance, inductive or electron beam heating. Chamber pressures during the coating are typically in the range of about $10^{-4}$ to $10^{-5}$ Torr. A particularly preferred means of evaporating an inorganic evaporative source is by electron beam technology.

Figure 1:
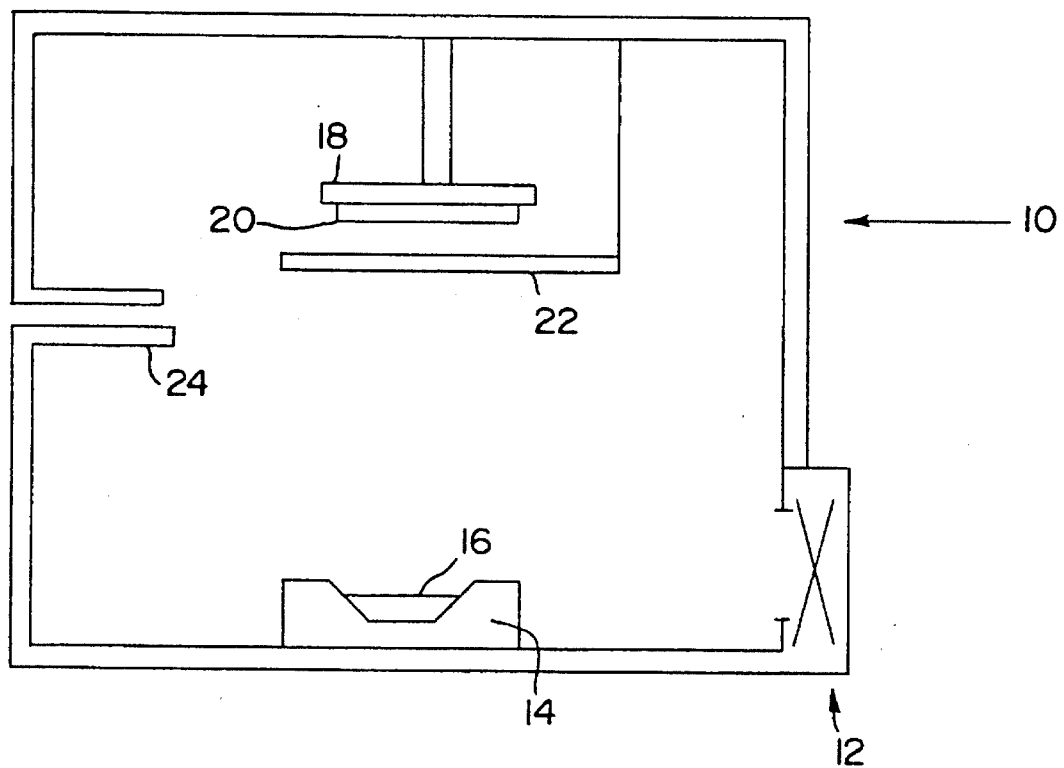
FIG. 1 is a schematic and cross-sectional view of a chamber for practicing the invention.

Suitable apparatus for practicing the invention can be simple modifications of conventional electron beam bell-jar configured systems. Thus, as schematically illustrated by FIG. 1, an evacuable chamber 10, that can be evacuated by vacuum pump 12 to pressures in the range of about $10^{-4}$ to about $10^{-5}$ Torr, includes an electron beam gun 14 and an inorganic source 16. Substrate holder 18 holds the substrate 20 a spaced distance from inorganic source 16. A shutter 22 is interposed between source 16 and substrate 20, typically adjacent to substrate 20. Practice of the present invention requires that the substrate 20 be in electrical isolation with respect to chamber 10, and thus substrate holder 18 should be either floating or grounded. Further, a gas inlet 24 communicates a source of vaporized organosilicon (not illustrated) into chamber 10 during evaporation of inorganic source 16. Inlet 24 is closer to substrate 20 than to the inorganic source 16.

Suitable inorganic sources to be evaporated in forming coatings of the invention include Al, Al$_2$O$_3$, Sb, Ba$_3$SiO$_4$, Cr, Cu, Au, MgF$_2$, Mo, Monel (30 Cu/70 Ni), Ni, NiCr, Nb, Si, SiO, SiO$_2$, Si$_3$N$_4$, Ta, Ti, W, and ZnS.

One phenomena of vacuum evaporation is the geometrical distribution pattern of evaporant atoms or molecules as they are emitted from the vapor source. Particles are not beamed from various points on the flat surface of the source, but rather appear to be beamed from a region in the perimeter of a viscous cloud. The actual shape of the viscous cloud is not known, but in practicing the present invention the substrate to be coated is sufficiently spaced from the evaporative source so as to be effectively outside the viscous region, or plasma. The substrate is either grounded or floating, and is in electrical isolation from the chamber (and thus also from the evaporative source except for the possibility of some charged species being deposited during coating). It is important that the substrate be maintained in electrical isolation from the chamber during the coating process of the invention.

This is because when the substrate surface is not in such electrical isolation (for example, where a plasma was activated near the substrate during coating), then the resulting coating had significantly inferior gas barrier properties than do coatings of the invention. I believe this effect may be due to a disassociation of the organosilicon that is intended for incorporation into the forming film when practicing the invention. As the inorganic evaporative source contacts the substrate surface, a film is formed that is substantially continuous and inorganic. This film can be envisioned as a substantially continuous inorganic matrix. Organosilicon moieties are incorporated into this growing film, but are discontinuously dispersed in the substantially continuous inorganic matrix.

The organosilicon is incorporated by flowing vaporized organosilicon into the chamber during the evaporation. Organosilicon is introduced into the chamber at a point closer to the substrate surface than to the inorganic evaporative source so as to incorporate organosilicon substantially in its monomeric, associated form (as opposed to incorporating as a polymeric species or as a dissociated species). For example, where a source-to-substrate distance is about 18" to about 24", then the organosilicon gas inlet will preferably be about 4" to about 5" from the substrate.

Organosilicon molecules that are incorporated into the growing inorganic film are bonded into the film matrix, but these organosilicon molecules are substantially associated and incorporated in molecular form. This was demonstrated by using FTIR measurements of Si-CH$_3$ (normalized for thickness) vibration as a function of the effective gas inclusion parameter (cc/Å). For example, since the organosilicon molecule structure in the case of tetramethyldisiloxane is

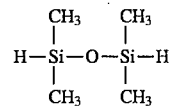

, thus the only source of a Si-CH$_3$ bond is from the organosilicon molecule itself. I have found that the FTIR Si-O-Si stretch and bending vibrational absorptions, when ratioed together, indicate whether the Si-CH$_3$ bonded moiety was incorporated into the coating. Since the data indicates that the Si-CH$_3$ moiety is incorporated and bound in the coating, and since this moiety is part of the organosilicon molecule itself, one can conclude that the entire organosilicon molecule was bonded into the film matrix.

Figure 2:
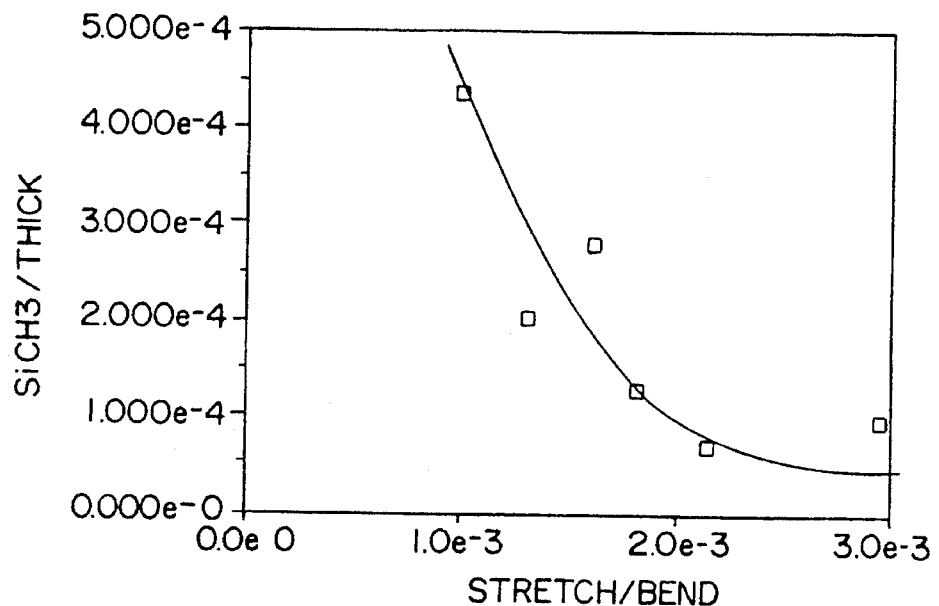
FIG. 2 is a graphical illustration of the bonding efficiency for the organosilicon that is incorporated into an inorganic component of a film of the invention.
Figure 3:
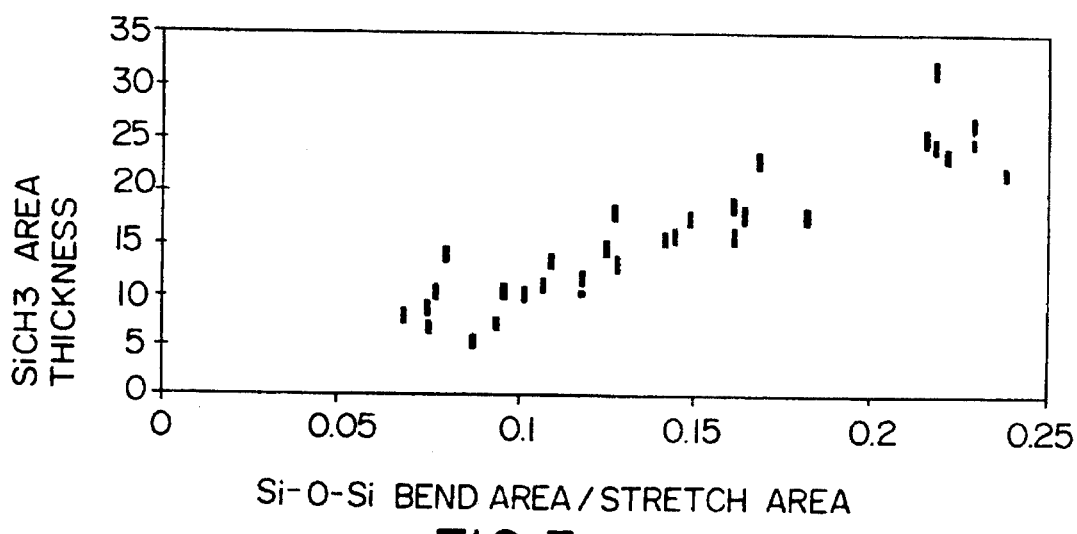
FIG. 3 is a graphical illustration of the effect on the bonding efficiency of a Si-CH$_3$ functional group in a film of the invention.

FIGS. 2 and 3 illustrate these stretch/bend data from the electron beam evaporation of SiO$_2$ into which has been flowed the organosilicon TMDSO. The FIG. 2 data show the response of the FTIR stretch/bend ratio as a function of the organosilicon gas inclusion, which is proportional to the Si-CH$_3$ area. The FIG. 3 data shows the response of a plasma produced coating in accordance with the invention in which the Si-CH$_3$ moiety is bonded into the inorganic Si-O-Si film. The similarity of the results for FIGS. 2 and 3 demonstrate that the organosilicon molecules are bonded into the inorganic structure. Without being limited by theory, I theorize that the improved gas barrier properties found when the organosilicon molecule is incorporated into the evaporating inorganic is due to the flexibility of the incorporated organosilicon molecule and its mobility to "densify" the thin film matrix to permeating gas species. On an atomic scale, the prior art silicon oxide thin films may be a porous, open-chained structure to the permeating oxygen molecules at room temperature conditions. By contrast, the incorporated organosilicon of the invention coatings may "densify" the thin film matrix, particularly because the incorporated organosilicon molecules may have rather amorphous, or mobile, structures which I believe are more resistant to gas diffusion than would be a more crystalline, or metallic, ordering.

Suitable organosilicons for practice of the invention include one or more (that is, mixtures) of methyltrimethoxysilane (MTMOS), dimethyldiethoxysilane (DMDEOS), tetraethoxysilane (TEOS), vinyltriethoxysilane (VTEOS), 3-methacryloxypropyltrimethoxysilane (MAPMEOS), vinyltris(2-methoxyethoxy)silane (VTMEOS), tetramethoxysilane (TMOS), trimethylethoxysilane (TMEOS), vinyltriacetoxysilane (VTAOS), ethyltriethoxysilane (ETEOS), tetrakis(2-ethylhexoxy)silane (TKEEOS), vinyltrimethoxysilane (VTMOS), tetrakis(2-methoxyethoxy) silane (TKMOEOS), methylphenyldimethoxysilane (MPDMOS), tetrakis(methoxyethoxyethoxy)silane (TKMOEOEOS), tetramethylsilane (TMS), dimethyldimethoxysilane (DMDMOS), n-propyltrimethoxysilane (PTMOS), tetrakis(2-ethylbutoxy)silane (TKEBS), n-octyltriethoxysilane (OTEOS), acetoxypropyltrimethoxysilane (APTMOS), tris(trimethylsiloxy)phenylsilane, octamethylcyclotetrasiloxane (OMOTSO), hexamethyldisiloxane (HMDSO), octamethyltrisiloxane (OMTSO), 1,2,3,3-tetrakis(trimethylsiloxy)disiloxane (TKTMSDSO), 1,2,3,3-tetramethyldisiloxane (TMDSO), and pentamethyldisiloxane (PMDSO). Organosilicons having methoxy functional groups (—$OCH_3$) are particularly preferred in practicing the invention.

The organosilicon gas stream flowed into the chamber is preferably entirely organosilicon. I have found that the inclusion of helium as a carrier tends to be detrimental to the film properties. Similarly, the inclusion of oxygen or of oxygen and helium have been found less desirable than flowing pure organosilicon.

Films of the invention with a substantially continuous inorganic matrix in which organosilicon moieties are discontinuously dispersed have reduced gas permeability with respect to prior art films formed only of an inorganic matrix. That is, inclusion of the organosilicon moieties in accordance with the invention decreases the gas or vapor permeability of the coating on a substrate surface. This phenomenon is illustrated by the data of Table 1, where a prior art electron beam evaporation of $SiO_2$ was used to form silicon oxide-based coatings. These prior art coatings were compared to coatings of the invention having had organosilicon incorporated during the electron beam evaporation of $SiO_2$. The PET substrates were 48 gauge.

TABLE 1

| Coating Composition Sources | Substrate | Coating Thickness (Å) | Coating Rate (Å/sec) | Oxygen Transmission (cc/m²/day) |
|---|---|---|---|---|
| $SiO_2$ (prior art) | PET | 1092 | 12.1 | 120 |
| $SiO_2$ + TMDSO (inventive) | PET | 1503 | 33.4 | 26.6 |

As can be seen from a comparison between the prior art, electron beam evaporated silicon dioxide coating and an inventive coating (where silicon dioxide was also evaporated by electron beam but the organosilicon TMDSO (1,1,3,3-tetramethyldisiloxane) was incorporated into the inventive coating) oxygen transmission was reduced by a factor of about 4 for the inventive coating.

Prior art electron beam evaporated silicon oxide films have adhesion problems, and can be readily removed from the substrate with tape. However, coatings of the invention that have been enhanced by organosilicon inclusion are more adherent. These coatings are not removed by an analogous "tape test." This enhanced adhesion is especially important for polyolefin substrates (e.g., polyethylene, polypropylene) since adhesion between thin films and these materials is difficult with standard evaporation techniques. The improved adhesiveness of the invention will also prove useful for coatings on glass, metals, and other plastics.

I have devised a parameter to measure the amount of organosilicon incorporated in the growing film. The amount of organosilicon incorporated is directly dependent upon the flow rate of the organosilicon gas stream, but is inversely dependent upon the evaporation rate of the inorganic source. Broadly, the amount of organosilicon to be incorporated, as determined by using the just-described parameter, is between about 0.003 cm³/Å to about 0.01 cm³/Å; however, for different inorganic sources, different substrates and for the different organosilicons (or mixtures) there are varying optimum amounts to be incorporated.

The incorporated organosilicon can be measured as a parameter in units of cc/Å where:

$$\frac{SCCM}{\text{Å/sec}} \quad \frac{\text{(gas flow)}}{\text{(evaporation rate)}}$$

This parameter (cc/Å) is sometimes described as the "effective gas inclusion parameter" and determines the optimal operating point of the process. As the cc/Å parameter value increases, then the amount of organosilicon incorporated into the growing film also increases. The optimal point of operation lies on the "knee" of the curve so plotted. Thus, one needs only determine the deposition rate (readily done with any number of commercially available instruments) and the gas flow rate (which can be measured directly from a gas flow meter) to determine the resulting properties of the coating. For increases in evaporation rate, increases in gas flow are required, while the inverse is also true.

The optimum gas flow for a given deposition system is easily determined by use of an empirical matrix of gas flow, deposition rate, and gas barrier. First, the static deposition rate of the evaporating system is determined. Second, various gas flows are calculated for the previously determined deposition rate so that the following gas inclusion parameters are satisfied:

| Effective Gas Inclusion (cc/Å) |
|---|
| 0.02 |
| 0.01 |
| 0.0067 |
| 0.005 |
| 0.0033 |
| 0.002 |

At each gas flow a deposition is completed and the resulting gas barrier properties measured. This data can be plotted and from the plot an operational area (generally, defined by the plotted curve's minima) determined. Production can then be controlled by monitoring the deposition rate (in real-time) and calculating the required gas flow to satisfy the target effective gas inclusion determined. As an example, with a deposition rate of 10,000 Å/min, one could have:

| Gas Flow Rate Calculated (SCCM) |
| --- |
| 200 |
| 100 |
| 67 |
| 50 |
| 33 |
| 20 |

The gas barrier properties for the films are generally inversely proportional to the line speed during production. Table 2 illustrates the gas barrier enhancement for coatings of the invention by comparison with several prior art, silicon oxide based coatings.

TABLE 2

| Coating Composition Sources | Voltage (Volts) | Current (amps) | Line Speed (m/min) | Oxygen Transmission (cc/ 100 in²/day) |
| --- | --- | --- | --- | --- |
| $SiO_2$ | 30 | 1.2 | 30 | 2.58 |
| (prior art) | 30 | 1.0 | 30 | 1.65 |
|  | 30 | 1.2 | 120 | 1.72 |
| $SiO_2$ + HMDSO | 30 | 1.0 | 120 | 0.88 |
| (inventive) | 30 | 1.0 | 250 | 0.28 |

Line speed is proportional to film thickness. With hexamethyldisiloxane (HMDSO) enhancement, I have achieved oxygen transmissions as little as 4 (cc/m²/day) on PET substrates having a thickness of 0.5 mil at line speeds of about 70–80 m/min. This is described in more detail by Example 1.

Films of the invention are typically transparent. Transparency can be determined by measuring the optical transmission of coated and uncoated 48 gauge polyester. Since coatings of $SiO_x$, with x less than 1.7, are colored and have a reduced transmission, the fact that the inventive films have very small changes in transmission demonstrates that the stoichiometry (for the silicon oxide-based films) is where x was greater than 1.7. Furthermore, FTIR studies have shown that the Si-O-Si peak position is proportional to the O:Si ratio and is equal to about 2.

An additional advantage of the invention is a reduced charge build-up, or static, of coated films with respect to a prior art electron beam process. Charge build-up is a common occurrence in roll coating applications and is characterized by "cling" and voltage buildup on rolls of material. For example, where the web comes close to the grounded chamber, one can observe a corona discharge. But in an analogous coating chamber, when organosilicon gas is being incorporated, then this corona effect is not observed. The web is more readily handled and does not give voltage shocks when touched in the coiled state.

EXAMPLE 1

The vacuum system was vented and a roll of 0.5 mil (48 gauge) polyethylene terephthalate (PET) film (26" wide×20,000 feet long) was loaded into the roll coater. The roll coater was then closed and evacuated to a pressure of $10^{-5}$ Torr. At this point the Institute Von Ardenne 150 kwatt linear electron beam gun was turned on and the filament heated. A $SiO_2$ quartz rod rotation was begun at a speed of 0.3 revolutions per minute (rpm). The shield protecting the PET film was closed over the $SiO_2$ rod so that no deposition could take place during the initial start-up. The electron beam gun acceleration voltage was fixed at 30,000 volts and the beam current slowly increased to 0.5 amps at which time the linear electron beam pattern was evident on the rotation $SiO_2$ rod. During the start-up, the PET film was advanced at less than 2 feet per minute. Once the electron line was apparent on the $SiO_2$ rod, the organosilicon flow was started. The gas inlet was upstream of the 36" diffusion pumps and was located at the PET film. Hexamethydisiloxane (HMDSO) was flowed at 200 SCCM into the process chamber where the pressure increased to $5\times10^{-4}$ Torr. The electron beam current was then increased to 1 amp and the pressure decreased to $2\times10^{-4}$ Torr. The PET film speed was increased to 70–80 meters/minute and the shield protecting the film opened. The deposition was run for 30 minutes at these conditions. Upon completion of the deposition, the electron beam was turned off an the HMDSO flow turned to 0. The chamber was allowed to pump for 30 minutes before venting. The chamber was vented to atmosphere and the sample removed. Upon measurement of the sample, an oxygen transmission rate of 4 cc/m²/day was measured for the inventive coating substrate.

EXAMPLE 2

The research machine was loaded with a static sample of 0.5 mil PET film, a glass slide (to determine the coating thickness), and a potassium bromide disk for FTIR measurement. $SiO_2$ pieces (⅛–¼") were loaded into the crucible of the electron beam gun. The chamber was evacuated to $10^{-5}$ Torr. The shield protecting the samples was left closed. Tetramethyldisiloxane flow was initiated and increased to approximately 1 SCCM. The electron beam was turned on and the power increased until a white glow was evident in the crucible. A coating was deposited for 45 seconds after which everything was turned off. The samples were removed and the coating thickness was determined to be 2250Å, which gave an effective gas inclusion parameter of 0.003 cm³/Å. The oxygen transmission rate was measured to be 5.4 cc/m²/day.

It is to be understood that while the invention has been described above in conjunction with preferred specific embodiments, the description and examples are intended to illustrate and not limit the scope of the invention, which is defined by the scope of the appended claims.

I claim:

1. A method for coating a surface with a gas barrier film comprising:

providing a substrate in an evacuated chamber, a surface of the substrate having a determinable initial gaseous permeability to oxygen or carbon dioxide;

contacting the surface with an inorganic evaporated species derived from evaporating an inorganic evaporative source, the surface and the inorganic source being a first spaced distance from one another within the chamber, the inorganic evaporated species forming a substantially continuous inorganic film on the surface during the contacting; and, incorporating an organosilicon into the forming film while maintaining the surface in electrical isolation from the chamber, the incorporated organosilicon being in a substantially organosilicon monomeric molecular form and being substantially discontinuous within the film, the incorporated organosilicon being derived from an organosilicon gas stream flowed into the chamber between the surface and the inorganic source.

2. The method as in claim 1 wherein the organosilicon incorporated is in a sufficient amount to decrease the gas permeability of the surface.

3. The method as in claim 1 wherein the amount of organosilicon incorporated is directly dependent upon the flow rate of the organosilicon gas stream and is inversely dependent upon the evaporation rate of inorganic source.

4. The method as in claim 3 wherein the amount of organosilicon incorporated is between about 0.003 cm$^3$/Å to about 0.01 cm$^3$/Å.

5. The method as in claim 1 wherein the organosilicon gas is flowed into the chamber at a point closer to the surface than to the inorganic source.

6. The method as in claim 1 wherein the organosilicon gas is a monomeric organo-functional silane or a monomeric disiloxane.

* * * * *